United States Patent
Orimoto et al.

(10) Patent No.: US 9,437,520 B2
(45) Date of Patent: Sep. 6, 2016

(54) SEMICONDUCTOR DEVICE INCLUDING A SEMICONDUCTOR ELEMENT AND A FIXED MEMBER TO WHICH THE SEMICONDUCTOR ELEMENT IS FIXED

(71) Applicants: Norimune Orimoto, Toyota (JP); Makoto Imai, Toyota (JP)

(72) Inventors: Norimune Orimoto, Toyota (JP); Makoto Imai, Toyota (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 14/774,444

(22) PCT Filed: Mar. 13, 2013

(86) PCT No.: PCT/JP2013/056925
§ 371 (c)(1),
(2) Date: Sep. 10, 2015

(87) PCT Pub. No.: WO2014/141399
PCT Pub. Date: Sep. 18, 2014

(65) Prior Publication Data
US 2016/0027714 A1    Jan. 28, 2016

(51) Int. Cl.
*H01L 23/36* (2006.01)
*H01L 23/367* (2006.01)
(Continued)

(52) U.S. Cl.
CPC .......... *H01L 23/3675* (2013.01); *H01L 23/13* (2013.01); *H01L 23/36* (2013.01); *H01L 23/562* (2013.01); *H01L 24/32* (2013.01); *H01L 24/29* (2013.01); *H01L 24/83* (2013.01); *H01L 2224/26175* (2013.01); *H01L 2224/291* (2013.01); *H01L 2224/29036* (2013.01); *H01L 2224/32014* (2013.01); *H01L 2224/32113* (2013.01); *H01L 2224/32245* (2013.01); *H01L 2224/83129* (2013.01); *H01L 2224/83191* (2013.01); *H01L 2224/83192* (2013.01); *H01L 2224/83385* (2013.01);
(Continued)

(58) Field of Classification Search
None
See application file for complete search history.

(56) References Cited

U.S. PATENT DOCUMENTS 6,516,994 B2 * 2/2003 Takahashi ......... H01L 23/49503
228/180.5
6,624,511 B2 * 9/2003 Sakamoto ........... H01L 21/4832
228/180.5
(Continued)

FOREIGN PATENT DOCUMENTS

JP       5-18030 U    3/1993
JP    2000-40707 A    2/2000
(Continued)

OTHER PUBLICATIONS

International Search Report issued Jun. 11, 2013 in PCT/JP2013/056925 filed Mar. 13, 2013.

*Primary Examiner* — Scott B Geyer
(74) *Attorney, Agent, or Firm* — Oblon, McClelland, Maier & Neustadt, L.L.P.

(57) ABSTRACT

A semiconductor device includes a semiconductor element having a rectangular shape in a plan view, and a fixed member to which the semiconductor element is fixed. The semiconductor element is disposed so that a rectangular face of the semiconductor element is faced toward a surface of the fixed member. A part of the rectangular face of the semiconductor element is fixed to the surface of the fixed member. At least corner parts of the rectangular face of the semiconductor element are not fixed to the surface of the fixed member.

8 Claims, 7 Drawing Sheets

(51) Int. Cl.
*H01L 23/00* (2006.01)
*H01L 23/13* (2006.01)

(52) U.S. Cl.
CPC ............... *H01L 2224/83444* (2013.01); *H01L 2224/83455* (2013.01); *H01L 2224/83815* (2013.01); *H01L 2924/10161* (2013.01); *H01L 2924/10272* (2013.01); *H01L 2924/13055* (2013.01); *H01L 2924/13091* (2013.01); *H01L 2924/15159* (2013.01); *H01L 2924/15165* (2013.01); *H01L 2924/351* (2013.01)

(56) References Cited

U.S. PATENT DOCUMENTS

| | | | |
|---|---|---|---|
| 2007/0246833 A1* | 10/2007 | Soga | H01L 23/24 257/772 |
| 2007/0278511 A1 | 12/2007 | Ohno et al. | |
| 2007/0278700 A1* | 12/2007 | St. Germain | H01L 23/3107 257/782 |
| 2009/0224279 A1 | 9/2009 | Shimokawa et al. | |
| 2011/0204457 A1* | 8/2011 | Ono | B81C 3/001 257/416 |
| 2012/0306087 A1 | 12/2012 | Bayerer et al. | |
| 2013/0181353 A1* | 7/2013 | Yaku | H01L 23/49838 257/773 |
| 2013/0256860 A1* | 10/2013 | Sato | H01L 23/49541 257/676 |

FOREIGN PATENT DOCUMENTS

| | | |
|---|---|---|
| JP | 2006-49777 A | 2/2006 |
| JP | 2008-166626 A | 7/2008 |
| JP | 2009-170702 A | 7/2009 |
| JP | 2010-10574 A | 1/2010 |
| JP | 2011-171426 A | 9/2011 |

* cited by examiner

SEMICONDUCTOR DEVICE INCLUDING A SEMICONDUCTOR ELEMENT AND A FIXED MEMBER TO WHICH THE SEMICONDUCTOR ELEMENT IS FIXED

TECHNICAL FIELD

The technology disclosed in this description relates to a semiconductor device.

BACKGROUND ART

A semiconductor device in which a semiconductor element and a heat sink are joined with solder has been developed There is a difference in a thermal expansion coefficient between the semiconductor element and the heat sink. Accordingly, as a temperature of the semiconductor device changes, there arises a difference in an amount of dimension change between the semiconductor element and the heat sink. The difference in the amount of dimension change is large on a diagonal line of the semiconductor element. Accordingly, thermal stress is likely to occur at four corner parts of the semiconductor element. In a semiconductor device disclosed in Japanese Patent Application Publication No. 2009-170702, a thickness of solder that joins corner parts of a semiconductor element and a heat sink (a substrate body) is made thicker than a thickness of portions other than the corner parts of the semiconductor element. Thereby, thermal stress occurring in the semiconductor element when the temperature of the semiconductor element changes is reduced.

SUMMARY OF INVENTION

Technical Problem

In the technology of Japanese Patent Application Publication No. 2009-170702, the thickness of solder is made thicker in the corner parts of the semiconductor element. Accordingly, size of the semiconductor device is increased. The present description provides a technology capable of reducing thermal stress occurring in a semiconductor element while suppressing the increase of size of a semiconductor device.

Solution to Technical Problem

A semiconductor device disclosed in the present description comprises a semiconductor element having a rectangular shape in a plan view and a fixed member to which the semiconductor element is fixed. The semiconductor element is disposed so that a rectangular face of the semiconductor element is faced toward a surface of the fixed member. A part of the rectangular face of the semiconductor element is fixed to the surface of the fixed member. At least corner parts of the rectangular face of the semiconductor element are not fixed to the surface of the fixed member.

In the semiconductor device mentioned above, the corner parts of the semiconductor element, in which thermal stress is likely to occur when the temperature of the semiconductor device changes, and the fixed member are not fixed to each other. Thereby, thermal stress occurring in the semiconductor element can be reduced. Moreover, since only a configuration where the corner parts of the semiconductor element and the fixed member are not fixed to each other is adopted, it is possible to suppress the increase of the size of the semiconductor device.

DESCRIPTION OF EMBODIMENTS

Some of specific features of embodiments and variations will be listed below. It should be noted that technical features described below are independent from each other, and may technically be useful alone.

In a semiconductor device disclosed in the present description, a rectangular face of a semiconductor element may be fixed to a surface of a fixed member with a joint material. A dent may be formed on the surface of the fixed member at a position corresponding to each of corner parts of the rectangular face of the semiconductor element.

In the semiconductor device mentioned above, when the semiconductor element is fixed to the fixed member, the joint material flows into portions in which the dents have been formed. Accordingly, the corner parts of the semiconductor element and the fixed member are prevented from being fixed to each other. Thereby, thermal stress occurring in the semiconductor element can be reduced.

In the semiconductor device disclosed in the present description, the semiconductor device may further comprise an intermediate member which is disposed between the rectangular face of the semiconductor element and the surface of the fixed member. The semiconductor element and the fixed member may be fixed to each other via the intermediate member. The intermediate member may not be positioned between at least the corner parts of the rectangular face of the semiconductor element and the surface of the fixed member.

In the semiconductor device mentioned above, the intermediate member is not positioned between the corner parts of the semiconductor element and the fixed member. Accordingly, the corner parts of the semiconductor element and the fixed member are prevented from being fixed to each other. Thereby, thermal stress occurring in the semiconductor element can be reduced.

First Embodiment

As shown in FIGS. 1 to 4, a semiconductor device 2 comprises a semiconductor element 4 and a heat sink 6 to which the semiconductor element 4 is fixed. The semiconductor element 4 is a so-called semiconductor chip. The semiconductor element 4 has a rectangular shape (specifically, a square shape) in a plan view. The semiconductor element 4 may alternatively be an oblong rectangle. Moreover, the semiconductor element 4 is an IGBT. The semiconductor element 4 may alternatively be other types of semiconductor elements, such as a MOSFET, for example.

The semiconductor element 4 comprises a SiC substrate. The SiC substrate has an active region 4a in a center part in the plan view, and has a peripheral region 4b around the active region 4a, specifically in an outer peripheral part of the semiconductor element 4 (see FIG. 3). In the active region 4a, respective regions of a gate, an emitter region, a body contact region, a body region, a drift region and a collector region are formed. However, since these configurations in the semiconductor element 4 are conventionally publicly known, their explanations will be omitted. On a front surface of the semiconductor element 4, an emitter electrode (not shown), a gate pad (not shown), and the body contact region are formed. On a back surface 42 of the semiconductor element 4, a collector electrode is formed. The collector electrode is formed on the entire area of the back surface 42 of the semiconductor element 4. The semiconductor element 4 is disposed such that the back surface 42 thereof is faced toward a surface 6a of the heat sink 6 that will be mentioned later.

The heat sink 6 is formed of metal. As a material for forming the heat sink 6, Cu (copper) can be used, for example. The heat sink 6 has a rectangular shape in the plan view (see FIG. 1). The heat sink 6 has a larger area than the semiconductor element 4. On the front surface 6a of the heat sink 6, dent parts 10 are formed. Each of the dent parts 10 is formed at a position corresponding to one of the corner parts of the semiconductor element 4 when the semiconductor element 4 is disposed on the front surface 6a of the heat sink 6 (that is, the dent parts 10 are formed in four places).

Each of the dent parts 10 has a shape of an isosceles right triangle in the plan view (each of the dent parts 10 may alternatively have other shapes, as will be mentioned later). An apex, at which two sides cross at a right angle in each of the dent parts 10, is positioned outside the semiconductor element 4. Each of apexes of the four corner parts of the semiconductor element 4 is positioned at a center of the corresponding dent part 10. The back surface 42 of the semiconductor element 4 has faces 44, which are portions that overlap with the corresponding dent parts 10, and a face 46, which is a portion that does not overlap with the dent parts 10, in the plan view (see FIG. 4). Fixation with solder 8 is not performed between the faces 44 and the heat sink 6 (the corresponding dent part 10 of the heat sink 6, in detail). Fixation with the solder 8 is performed between the face 46 and the heat sink 6 (a portion where the dent parts 10 are not formed in the heat sink 6, in detail).

Figure 3:
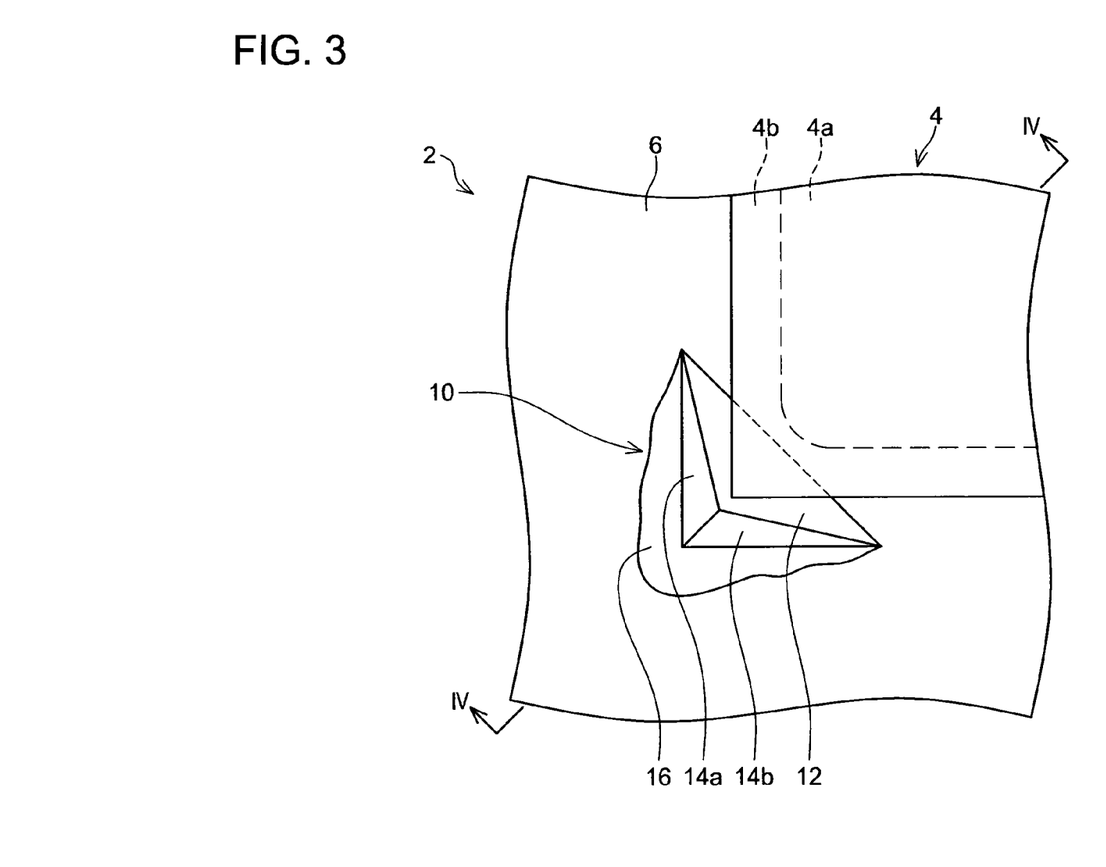
FIG. 3 is a partial enlarged plan view of the semiconductor device 2 of the first embodiment
Figure 4:
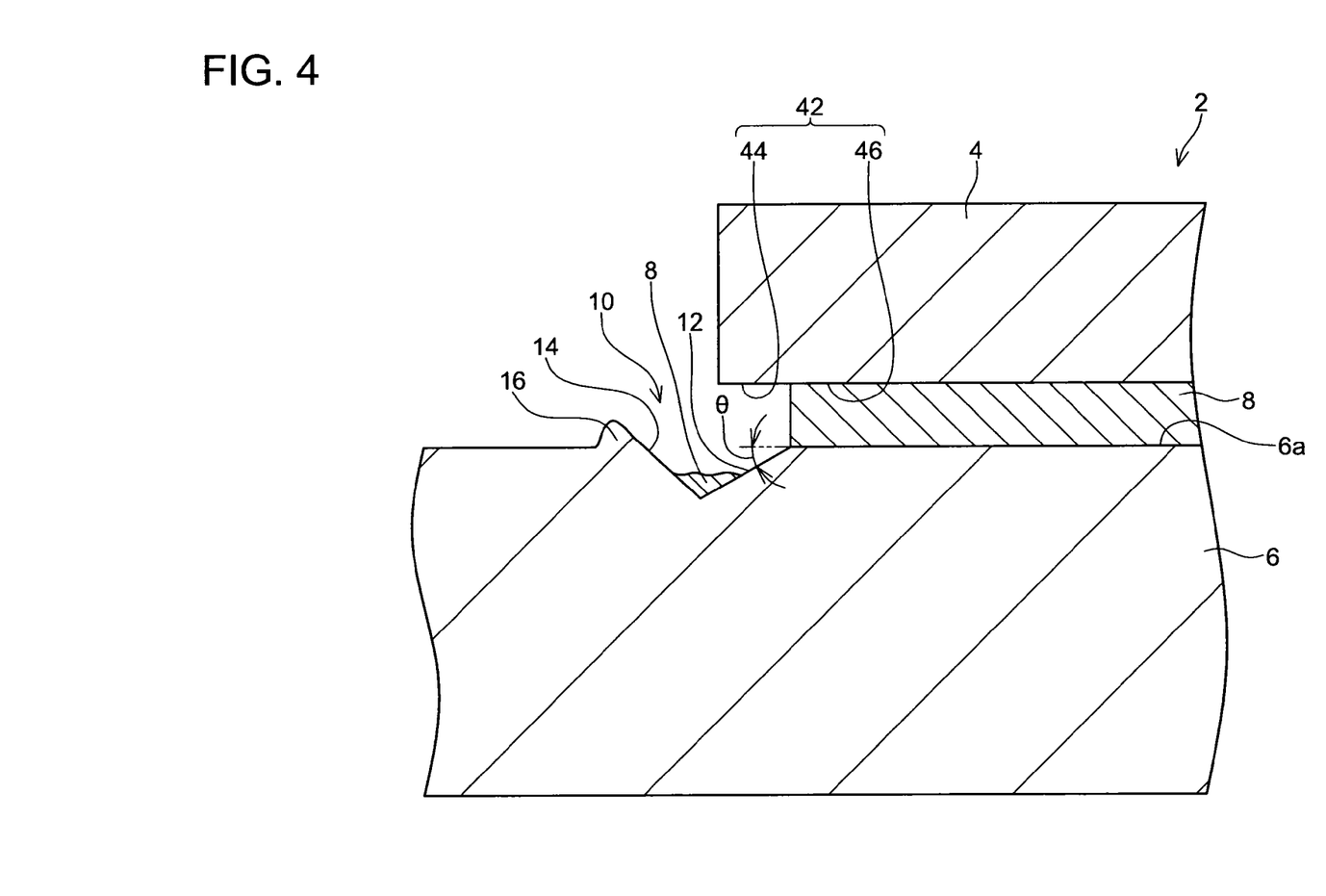
FIG. 4 is a partial enlarged cross sectional view of the semiconductor device 2 of the first embodiment taken along a line IV-IV in FIG. 3.

As shown in FIGS. 3 and 4, inner surfaces of each of the dent parts 10 have a face 12, a face 14a, and a face 14b (the face 14a and the face 14b are combined to be represented as a face 14 in FIG. 4). The face 12 is positioned on a center side of the semiconductor element 4. The faces 14a, 14b are positioned on a side opposite of the center side of the semiconductor element 4. The face 12 inclines relative to the front surface 6a of the heat sink 6. An angle made between the face 12 and the front surface 6a of the heat sink 6 is called an angle θ in the explanation below. The angle θ can be made smaller than, for example, 45 degrees. The angle θ will be mentioned later. Excessive metals 16 are formed on the front surface 6a of the heat sink 6. Each of the excessive metals 16 is formed on the opposite side of a center of the semiconductor element 4 relative to the corresponding dent part 10. As mentioned above, the back surface 42 (specifically, the face 46 which is a part of the back surface 42) of the semiconductor element 4 and the heat sink 6 are fixed to each other with the solder 8. Thereby, the semiconductor element 4 and the heat sink 6 are electrically connected. As a result, the heat sink 6 can be used as an electrode (an electrode on a collector side, in detail) of semiconductor device 2. Moreover, while the semiconductor device 2 is in use, heat generated in the semiconductor element 4 can be radiated outside via the heat sink 6. Thereby, the temperature rise of the semiconductor element 4 can be suppressed.

Explanations will be made below on a method for manufacturing the semiconductor device 2 of the present embodiment. The heat sink 6 is manufactured by forming the dent parts 10 on the front surface 6a of a plate made of copper. As a method for forming the dent parts 10, press working can be used as an example. Press working is performed so that the excessive metals 16 of the heat sink 6 may be formed on the opposite side of the center of the semiconductor element 4 relative to the corresponding dent part 10.

After the dent parts 10 are formed on the heat sink 6, a sheet-like solder (hereafter this is called a solder sheet) is disposed on the front surface 6a of the heat sink 6. The solder sheet (not shown) can be made, for example, so as to have the same shape (that is, a rectangular shape) and the same size as the semiconductor element 4 when it is viewed in the plan view. The solder sheet is disposed so that each of the corner parts of the solder sheet is positioned above the corresponding dent part 10. After the solder sheet is disposed on the front surface 6a of the heat sink 6, the semiconductor element 4 is disposed on the solder sheet. As mentioned above, the semiconductor element 4 is disposed so that each of the corner parts of the semiconductor element 4 is positioned above the corresponding dent part 10. That is, by disposing the semiconductor element 4, the semiconductor element 4 is superposed on the solder sheet.

The excessive metals 16 of the heat sink 6 produced by press working are formed on the opposite side of the center of the semiconductor element 4 relative to the corresponding dent part 10, as mentioned above. That is, each of the excessive metals 16 is formed at a position which does not overlap with the semiconductor element 4 in the plan view. Accordingly, when the semiconductor element 4 is disposed, interference occurring between the semiconductor element 4 and the excessive metals 16 is suppressed.

Next, a temperature of the semiconductor device 2 is raised to a temperature that is a melting point of the solder 8 or higher. As the temperature is raised, the solder sheet melts into a liquid state. At positions other than the corner parts of the semiconductor element 4 (that is, positions where the dent parts 10 are not formed), a liquid-state solder 8 is filled between the back surface 42 of the semiconductor element 4 and the front surface 6a of the heat sink 6 At this time, the solder 8, which is positioned at the corner parts of the back surface 42 of the semiconductor element 4 (that is, positions which overlap the dent parts 10), flows into the corresponding dent part 10 and accumulates at a bottom of the corresponding dent part 10. A volume of the dent part 10 is designed in advance so as to become larger than a volume of the solder 8 positioned above the corresponding dent part 10. Accordingly, the liquid-state solder 8 is not filled between the corner parts of the back surface 42 of the semiconductor element 4 and the front surface 6a of the heat sink 6. On the front surface 6a of the heat sink 6, surface treatment that improves wettability of the solder 8 may be performed in advance. As the surface treatment, for example, Ni-plating and Au-plating can be used Moreover, this surface treatment may be performed on the back surface 42 of the semiconductor element 4. Moreover, the semiconductor device 2 may adopt a configuration where this surface treatment is not performed on positions that correspond to the faces 44 mentioned above and the dent parts 10. Thereby, it is prevented that the solder 8 exists at the corner parts of the semiconductor element 4. As a result, it is prevented that the corner parts of the semiconductor element 4 and the heat sink 6 are fixed.

Next, the temperature of the semiconductor device 2 is lowered to a temperature that is the melting point of the solder 8 or lower. As the temperature lowers, the liquid-state solder 8 solidifies. Thereby, the back surface 42 of the semiconductor element 4 (the face 46 that is a part of the back surface 42, in detail) and the front surface 6a of the heat sink 6 are fixed with the solder 8 that has become solidified. On the other hand, at the dent parts 10 in which the liquid-state solder 8 is not filled, the back surface 42 of the semiconductor element 4 (the faces 44 that are parts of the back surface 42, in detail) and the front surface 6a of the heat sink 6 are not fixed even if the temperature is lowered.

In the semiconductor device 2 of the present embodiment, the corner parts of the semiconductor element 4, at which thermal stress is likely to occur, and the heat sink 6 are not fixed to each other. Thereby, thermal stress occurring in the semiconductor element 4 when the temperature of the semiconductor device 2 changes can be reduced. Moreover, since only a configuration where the corner parts of the semiconductor element 4 and the heat sink 6 are not fixed to each other is adopted, it is possible to suppress the increase of the size of the semiconductor device 2.

Moreover, as mentioned above, the semiconductor element 4 has the active region 4a in the center part of the semiconductor element 4 (the semiconductor substrate, in detail) in the plan view, and has the peripheral region 4b in the outer peripheral part of the semiconductor element 4. Unlike the active region, the peripheral region 4b does not generate heat with the use of the semiconductor element 4. Accordingly, a temperature of the center part of the semiconductor element 4 can be higher than a temperature of the corner parts of the semiconductor element 4. Moreover, in the peripheral part of the semiconductor element 4, heat is likely to be radiated to the environment On the other hand, in the center part of the semiconductor element 4, heat is unlikely to be radiated to the environment Also for this reason, in the semiconductor element 4 having a rectangular shape, the temperature of the center part of the semiconductor element 4 can be higher than the temperature of the corner parts of the semiconductor element 4.

When the temperature of the center part of the semiconductor element 4 becomes higher than the temperature of the corner parts of the semiconductor element 4, the quantity of heat transferred from the corner parts of the semiconductor element 4 to the heat sink 6 is smaller compared to the quantity of heat transferred from the center part of the semiconductor element 4 to the heat sink 6. In the semiconductor device 2 of the present embodiment, positions at which the back surface 42 of the semiconductor element 4 and the front surface 6a of the heat sink 6 are not fixed are the positions of the corner parts where the quantity of heat to be transferred is small Accordingly, while fixation is being performed partially between the back surface 42 of the semiconductor element 4 and the front surface 6a of the heat sink 6, reduction of the quantity of heat that is transferred from the semiconductor element 4 to the heat sink 6 is suppressed.

Each of the dent parts 10 may be formed at a position so as to overlap with the peripheral region 4b of the semiconductor device 2 in the plan view. Thereby, the dent parts 10 do not inhibit the heat transfer from the semiconductor element 4 to the heat sink 6. Thereby, deterioration of heat radiation performance of the semiconductor device 2 is suppressed.

Figure 1:
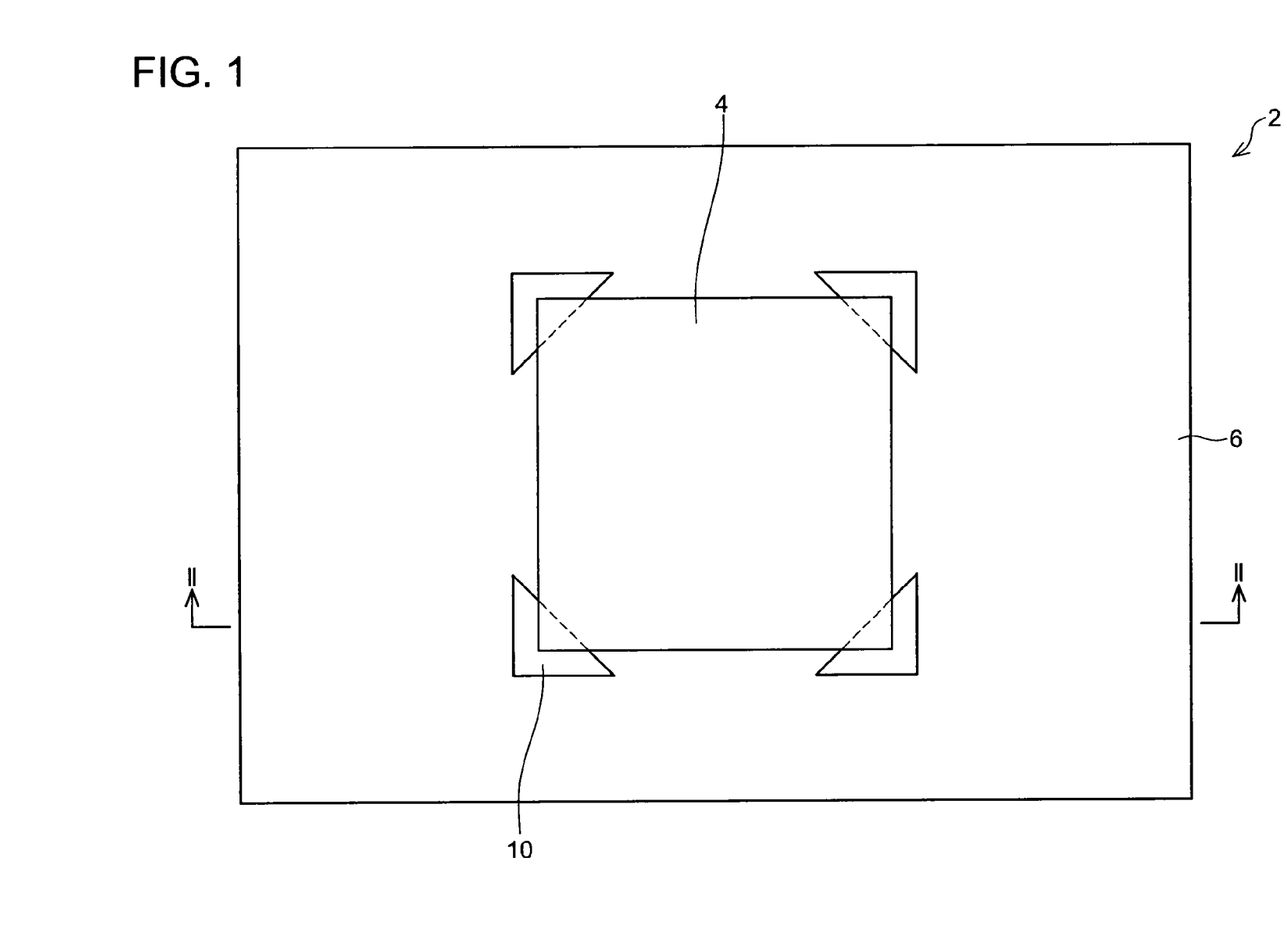
FIG. 1 is a plan view showing a semiconductor device 2 of a first embodiment
Figure 2:
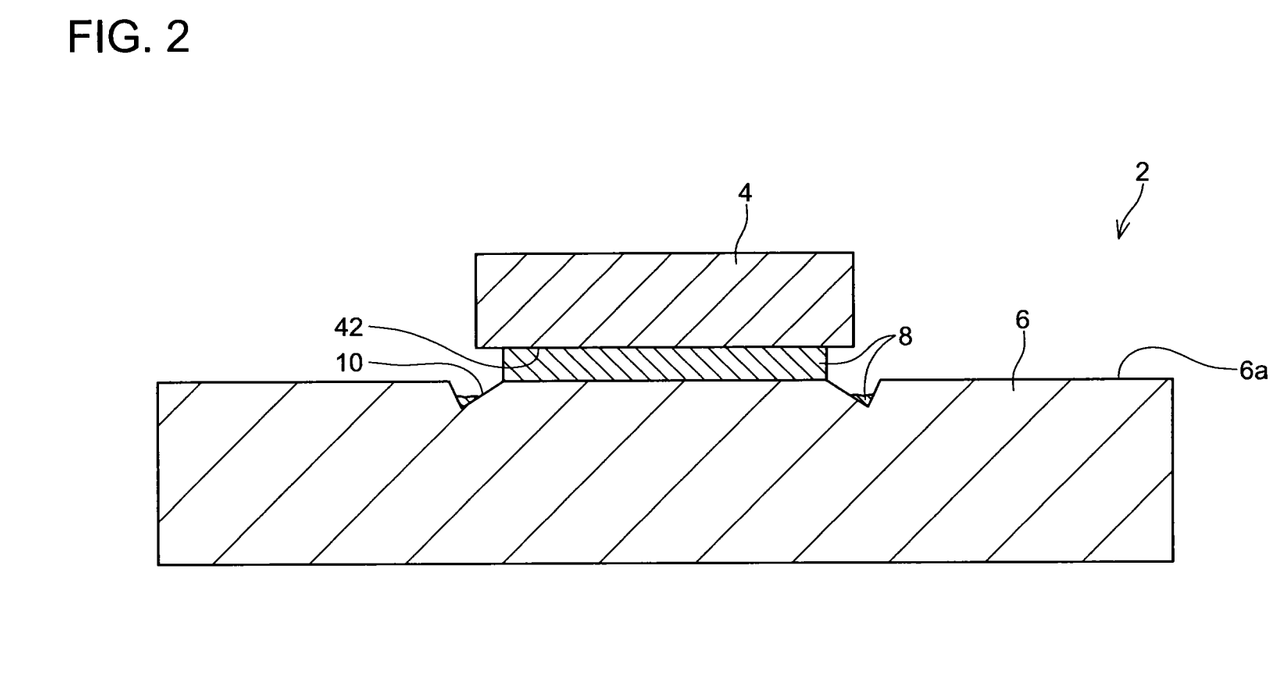
FIG. 2 is a cross sectional view of the semiconductor device 2 of the first embodiment taken along a line II-II in FIG. 1.

In the semiconductor device 2 in which the semiconductor element 4 is fixed to the heat sink 6, heat generated from the semiconductor element 4 is transferred to the heat sink 6 via the solder 8. In FIG. 2, heat generated from the semiconductor element 4 is transferred from a region in which the solder 8 is positioned toward inside (a lower side in FIG. 2) of the heat sink 6. When heat is transferred toward the inside of the heat sink 6, it is transferred from the region in which the solder 8 is positioned, not only toward a straightly lower direction, but also toward wider directions compared to the region in which the solder 8 is positioned. That is, a heat transfer path, through which the heat is transferred from the front surface 6a of the heat sink 6 to the inside of the heat sink 6, is formed so as to gradually widen from the front surface 6a of the heat sink 6 toward a deeper position of the heat sink 6. In the semiconductor device 2 of the present embodiment, the angle θ made between the inner surface of the corresponding dent part 10 and the rectangular face of the semiconductor element 4 is made smaller than 45 degrees. Accordingly, it is suppressed that forming the dent parts 10 on the heat sink 6 cause a width of the heat transfer path mentioned above to narrow. Thereby, deterioration of the heat radiation performance of the semiconductor device 2 due to the dent parts 10 is suppressed.

In the semiconductor device 2 of the present embodiment, the dent parts 10 are formed on the front surface 6a of the heat sink 6. Accordingly, in the manufacturing process of the semiconductor device 2, when disposing the solder sheet, the semiconductor element 4, a jig (for example, a jig for performing reflow of the solder 8), etc. on the front surface 6a of the heat sink 6, each of the dent parts 10 can be used as a mark for alignment In the semiconductor device 2 of the present embodiment, the dent parts 10 are formed by press working. Accordingly, unlike a case where the dent parts 10 are formed by cutting work or the like, the volume of the heat sink 6 does not decrease due to the processing of the dent parts 10. Accordingly, a heat capacity of the heat sink 6 does not decrease. Thereby, deterioration of the heat radiation performance of the semiconductor device 2 is suppressed.

In the above embodiment, a solder sheet was disposed between the semiconductor element 4 and the heat sink 6, and then by raising temperature, a liquid-state solder 8 was filled between the semiconductor element 4 and the heat sink 6. However, the liquid-state solder 8 may be filled by applying a liquid-state solder 8 to either the back surface of the semiconductor element 4 or the front surface 6a of the heat sink 6.

In the above embodiment, a shape of each of the dent parts 10 is a triangle in the plan view. However, the shape of each of the dent parts 10 may alternatively be other shapes. For example, each of the dent parts 10 may have a semicircular shape, a circular shape, an elliptic shape, a rectangular shape, a polygonal shape, etc. Moreover, in the above embodiment, each of the dent parts 10 was formed by press working. However, each of the dent parts 10 may be formed by other methods such as cutting work.

Second Embodiment

Figure 5:
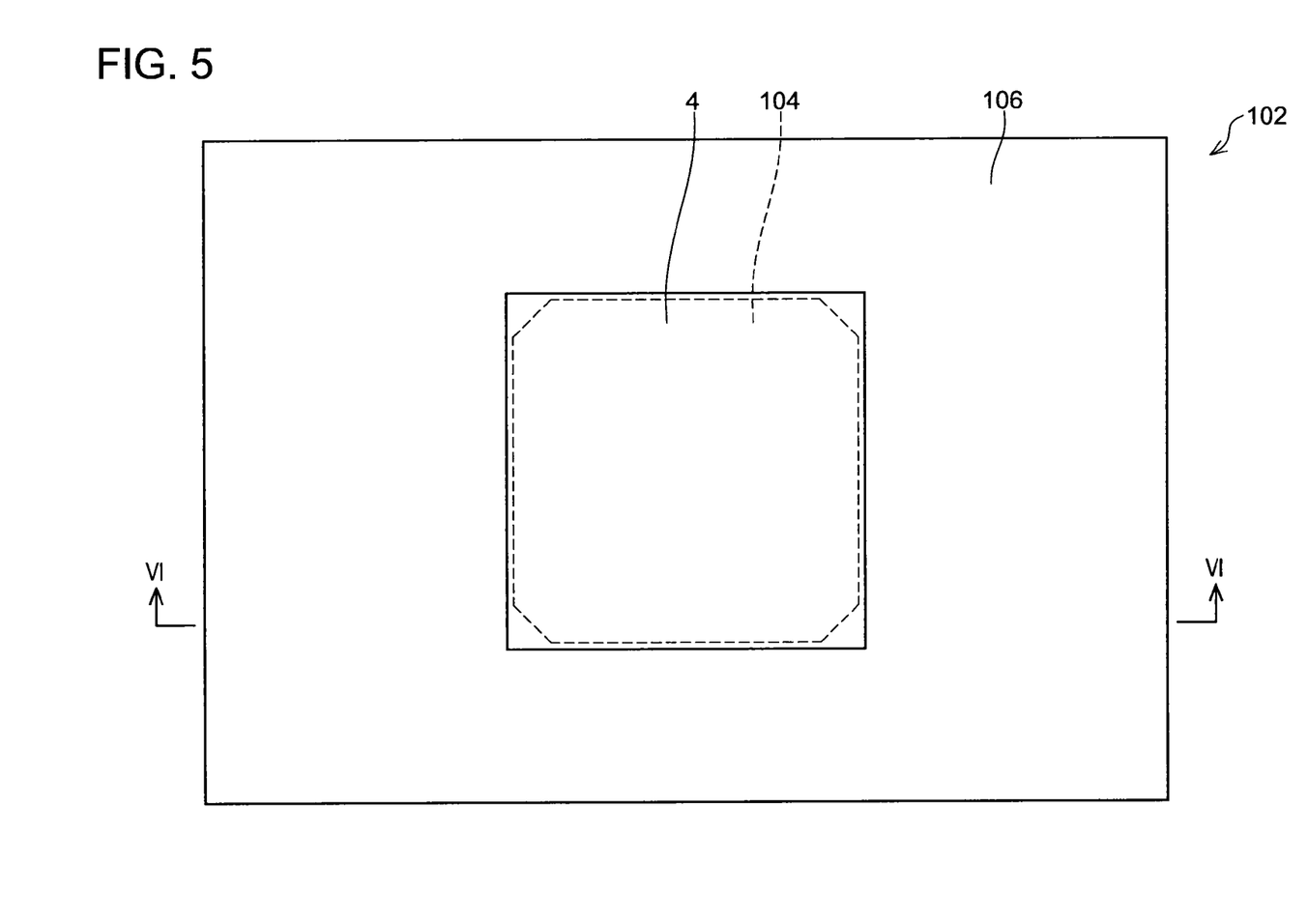
FIG. 5 is a plan view showing a semiconductor device 102 of a second embodiment
Figure 6:
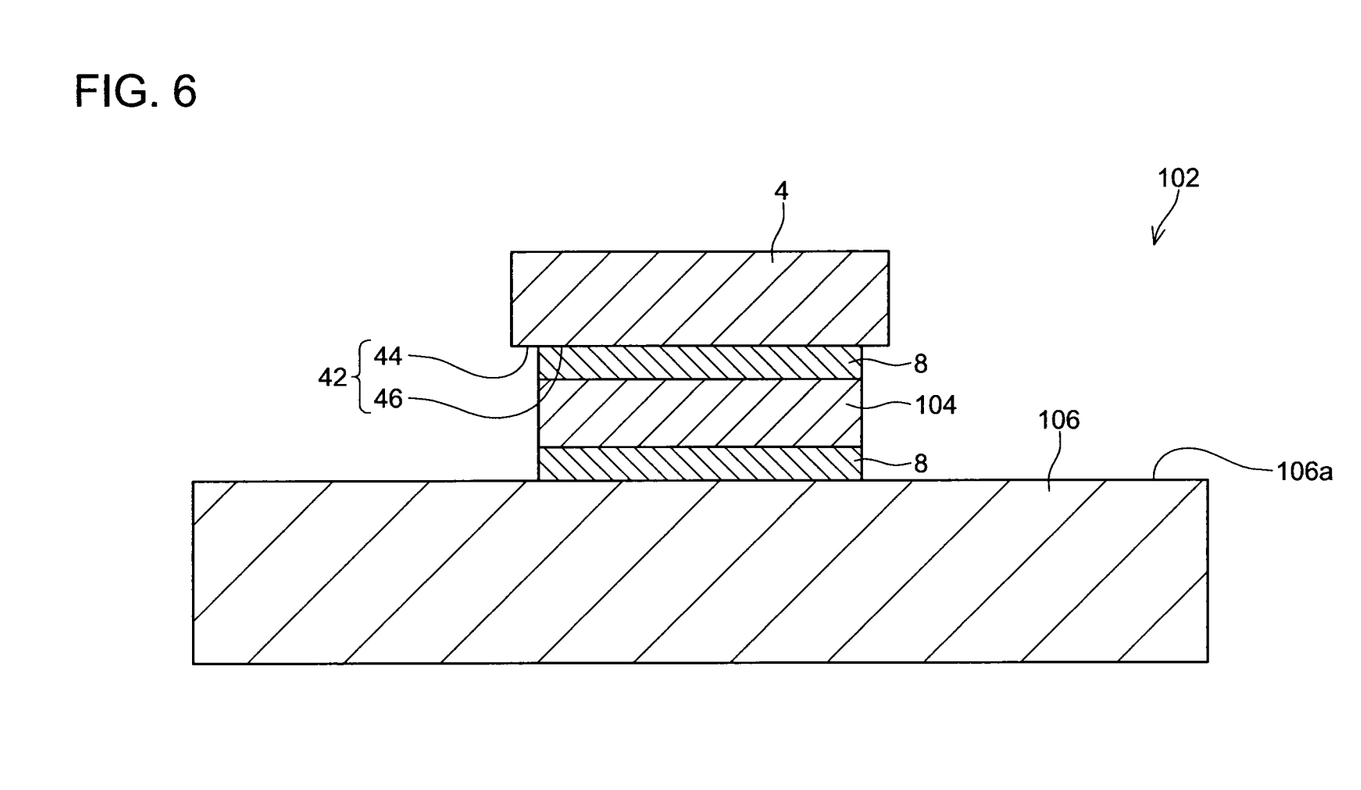
FIG. 6 is a cross sectional view of the semiconductor device 102 of the second embodiment taken along a line VI-VI in FIG. 5.

As shown in FIGS. 5 and 6, a semiconductor device 102 of the second embodiment comprises the semiconductor element 4, a heat sink 106, and an intermediate member 104. The heat sink 106 is formed of Cu (copper) similarly to the heat sink 6 of the first embodiment. The intermediate member 104 is disposed on the front surface 106a of the heat sink 106. The intermediate member 104 is plate-shaped, and has a rectangular shape in a plan view. However, the intermediate member 104 has a shape with the corner parts thereof chamfered in the plan view. The intermediate member 104 is formed of metal. As an example of a material for forming the intermediate member 104, CuMo (molybdenum copper) can be used. Explanations will be made later in detail on a material for forming the intermediate member 104. The front surface 106a of the heat sink 106 and the back surface of the intermediate member 104 are fixed with the solder 8.

The semiconductor element 4 is disposed on the front surface of the intermediate member 104. The front surface of the intermediate member 104 and the back surface 42 of the semiconductor element 4 are fixed with the solder 8. However, since chamfering is performed on the intermediate member 104, the intermediate member 104 does not exist at a position corresponding to each of the corner parts of the semiconductor element 4. Accordingly, the corner parts of the semiconductor 4 and the intermediate member 104 are not fixed to each other.

In the semiconductor device 102 of the present embodiment, the corner parts of the semiconductor element 4, at which thermal stress is likely to occur, and the intermediate member 104 are not fixed to each other. Thereby, as the temperature of the semiconductor device 102 changes, thermal stress occurring in the semiconductor element 4 can be reduced.

When it is assumed that the coefficient of linear expansion of the semiconductor element 4 is $\alpha_1$, the coefficient of linear expansion of the intermediate member 104 is $\alpha_2$ and that the coefficient of linear expansion of the heat sink 106 is $a_3$, a material of the intermediate member 104 is selected so that a relationship of $\alpha_1 \leq \alpha_2 < \alpha_3$ may be satisfied. For example, when the semiconductor element 4 (specifically, a semiconductor substrate) is formed of SiC and the heat sink 106 is formed of Cu (copper), CuMo (molybdenum copper) can be used as a material for forming the intermediate member 104. Moreover, when the coefficient of linear expansion of the semiconductor element 4 ($\alpha_1$) is larger than the coefficient of linear expansion of the heat sink 106 ($\alpha_3$), the material of the intermediate member 104 may be selected so that a relationship of an $\alpha_1 \geq \alpha_2 > \alpha_3$ may be satisfied. Note that the coefficient of linear expansion of the intermediate member 104 ($\alpha_2$) may be equal to the coefficient of linear expansion of the semiconductor element 4 ($\alpha_1$).

There is a difference in the coefficient of linear expansion between the semiconductor element 4 and the heat sink 106. Accordingly, in a semiconductor device in which the semiconductor element 4 is directly fixed to the heat sink 106 with solder, when a temperature of the semiconductor device is raised, thermal stress occurs according to a difference in the amount of dimension change between the semiconductor element 4 and the heat sink 106. In the semiconductor device 102 of the second embodiment, the semiconductor element 4 and the heat sink 106 are fixed via the intermediate member 104. Moreover, the coefficient of linear expansion of the intermediate member 104 ($\alpha_2$) satisfies the relationship of $\alpha_1 \leq \alpha_2 < \alpha_3$. With the above relationship satisfied, a difference in the amount of dimension change between the semiconductor element 4 and the intermediate member 104 becomes smaller than a difference in the amount of dimension change between the semiconductor element 4 and the heat sink 106. Accordingly, in the semiconductor device 102 of the present embodiment, thermal stress occurring in the semiconductor element 4 can be reduced compared to a case where the semiconductor element 4 is directly fixed to the heat sink 106.

COMPARATIVE EXAMPLE

Explanations will be made below on a result of numerical computation with respect to thermal stress analysis for a semiconductor device (not shown) of the comparative example (see FIG. 7). This thermal stress analysis is performed by simulating a cooling/heating cycle test. The semiconductor device of the comparative example has a configuration substantially identical to that of the semiconductor device 2 of the first embodiment. Therefore, explanations will be made on the configuration of the semiconductor device of the comparative example by using FIG. 1. In the semiconductor device of the comparative example, the semiconductor element 4 is fixed to the front surface of the heat sink 6, similarly to the semiconductor device 2 of the first embodiment (see FIG. 1). However, in the comparative example, the dent parts 10 are not formed on the surface of the heat sink 6, unlike the case of the first embodiment. Accordingly, in the semiconductor device of the comparative example, an entire area (including corner parts) of the back surface 42 of the semiconductor element 4 is fixed to the front surface of the heat sink 6.

Figure 7:
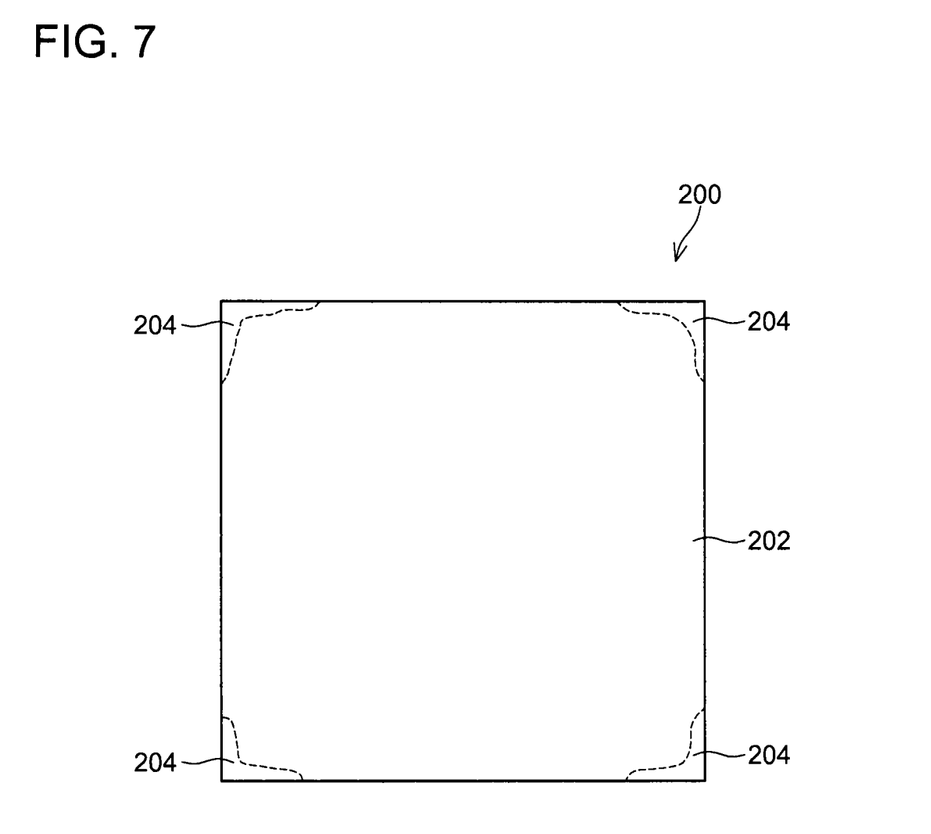
FIG. 7 shows a result of numerical computation with respect to thermal stress analysis that is performed by simulating a cooling/heating cycle test for a semiconductor device of a comparative example.

The result of numerical computation represented in FIG. 7 is related to nonlinear strain amplitude. FIG. 7 shows distribution of a region 204 where the magnitude of nonlinear strain amplitude is relatively large and a region 202 where the magnitude of nonlinear strain amplitude is relatively small. Nonlinear strain amplitude is calculated using a formula of (plastic strain+creep strain)/2. At a position in which the magnitude of nonlinear strain amplitude is large, thermal stress occurring in the semiconductor element 4 is also large. The region 204 where nonlinear strain amplitude is relatively large is positioned at each of the corner parts of the back surface 200 of the semiconductor element 4. That is, FIG. 7 shows that thermal stress occurring at the corner parts of the semiconductor element 4 is larger than thermal stress occurring in other parts. In the respective corresponding semiconductor devices 2 and 102 of embodiments 1 and 2, the corner parts of the back surface 42 of the semiconductor element 4, at which thermal stress is likely to become large, and the heat sink are not fixed to each other. Accordingly, in the respective corresponding semiconductor devices 2 and 102 of embodiments 1 and 2, thermal stress occurring in the semiconductor element 4 can be effectively reduced.

In the above embodiments, the semiconductor element 4 comprised a SiC substrate. However, the semiconductor element 4 may comprise a Si substrate.

In the above first embodiment, fixation with the solder 8 was performed between the back surface 42 of the semiconductor element 4 and the portion of the heat sink 6 in which the dent parts 10 are not formed. However, there may exist a spot (for example, a void etc.) in which fixation is not partially performed between the two. Similarly, there may exist a spot in which fixation is not partially performed between the back surface 42 of the semiconductor element 4 of above second embodiment and the front surface of the intermediate member 104.

Specific examples of the present invention have been described in detail, however, these are mere exemplary indications and thus do not limit the scope of the claims. The art described in the claims includes modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

The invention claimed is:

1. A semiconductor device comprising:
   a semiconductor element having a rectangular shape in a plan view; and
   a fixed member to which the semiconductor element is fixed, wherein
   the semiconductor element is disposed so that a rectangular face of the semiconductor element is faced toward a surface of the fixed member,
   a part of the rectangular face of the semiconductor element is fixed to the surface of the fixed member with a joint material,
   a dent having a pointed bottom is provided on the surface of the fixed member at a position corresponding to each of the corner parts of the rectangular face of the semiconductor element, and
   at least corner parts of the rectangular face of the semiconductor element are not fixed to the surface of the fixed member.

2. The semiconductor device according to claim 1, wherein
   the pointed bottom of each of the dents is positioned inside the corresponding dent in a plan view of the fixed member.

3. The semiconductor device according to claim 2, wherein
   each of the dents has a semi-conical shape, a conical shape, an elliptic conical shape, or a polygonal pyramid shape.

4. The semiconductor device according to claim 2, wherein
   each of the dents has a three-sided pyramid shape.

5. The semiconductor device according to claim 4, wherein
   each of the dents includes a center-sided face positioned on a center side of the semiconductor element, and
   an angle formed by the center-sided face of each of the dents and a surface of the fixed member is less than 45 degrees.

6. The semiconductor device according to claim 1, wherein
   each of the dents has a semi-conical shape, a conical shape, an elliptic conical shape, or a polygonal pyramid shape.

7. The semiconductor device according to claim 1, wherein
   each of the dents has a three-sided pyramid shape.

8. The semiconductor device according to claim 7, wherein
   each of the dents includes a center-sided face positioned on a center side of the semiconductor element, and
   an angle formed by the center-sided face of each of the dents and a surface of the fixed member is less than 45 degrees.

* * * * *